US012698571B2

(12) United States Patent
Tao et al.

(10) Patent No.: US 12,698,571 B2
(45) Date of Patent: Aug. 4, 2026

(54) SEMICONDUCTOR PROCESSING CHAMBER, SEMICONDUCTOR PROCESSING EQUIPMENT AND VAPOR EPITAXY EQUIPMENT

(71) Applicant: ADVANCED MICRO-FABRICATION EQUIPMENT INC. CHINA, Shanghai (CN)

(72) Inventors: Heng Tao, Shanghai (CN); Yunling Pang, Shanghai (CN); Hai Cong, Shanghai (CN); Yong Jiang, Shanghai (CN); Gerald Zhe Yao Yin, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 368 days.

(21) Appl. No.: 18/381,357

(22) Filed: Oct. 18, 2023

(65) Prior Publication Data

US 2025/0129511 A1 Apr. 24, 2025

(51) Int. Cl.
*C30B 25/16* (2006.01)
*C23C 16/455* (2006.01)
(Continued)

(52) U.S. Cl.
CPC ........ *C30B 25/16* (2013.01); *C23C 16/45557* (2013.01); *C23C 16/482* (2013.01); *C30B 25/08* (2013.01); *C30B 25/10* (2013.01)

(58) Field of Classification Search
CPC ......... C30B 25/16; C30B 25/08; C30B 25/10; C23C 16/482; C23C 16/45557
See application file for complete search history.

(56) References Cited

U.S. PATENT DOCUMENTS

| | | | |
|---|---|---|---|
| 2013/0078743 A1 | 3/2013 | Brenninger | |
| 2015/0136026 A1 | 5/2015 | Yang et al. | |

(Continued)

FOREIGN PATENT DOCUMENTS

| | | | |
|---|---|---|---|
| JP | 2006507680 A | 3/2006 | |
| JP | 2013070058 A | 4/2013 | |

(Continued)

*Primary Examiner* — JaMel M Nelson
(74) *Attorney, Agent, or Firm* — Womble Bond Dickinson (US) LLP

(57) ABSTRACT

Disclosed herein are a semiconductor processing chamber, semiconductor processing equipment and vapor epitaxy equipment, solving technical problems of process gas uniformity, infrared radiation transmittance and pressure-bearing capacity in the field of semiconductor processing. Mainly, an upper cover of a processing chamber is covered by a pressure-bearing shell and a confined space is formed, a pressure-regulating device is configured to regulate air pressure of the confined space and further regulate air pressure borne by upper and lower surfaces of the upper cover of the semiconductor processing chamber, the structural design of the upper cover is optimized, such that, in a semiconductor processing process, in order to realize processing with higher uniformity and higher quality on a surface of a substrate, the upper cover can be improved in a larger range to obtain a more optimized processing space.

35 Claims, 10 Drawing Sheets

(51) Int. Cl.
   *C23C 16/48* (2006.01)
   *C30B 25/08* (2006.01)
   *C30B 25/10* (2006.01)

(56) References Cited

U.S. PATENT DOCUMENTS

| | | |
|---|---|---|
| 2016/0351429 A1 | 12/2016 | Tao et al. |
| 2021/0358781 A1 | 11/2021 | Tao et al. |
| 2023/0290610 A1 | 9/2023 | Sa et al. |
| 2024/0134151 A1* | 4/2024 | Moradian ............. C30B 25/105 |

FOREIGN PATENT DOCUMENTS

| | | |
|---|---|---|
| JP | 2015520514 A | 7/2015 |
| TW | 201642376 A | 12/2016 |
| TW | 201712786 A | 4/2017 |
| TW | 202143363 A | 11/2021 |
| WO | 2004049405 A1 | 6/2004 |
| WO | 2022080637 A1 | 4/2022 |

* cited by examiner

SEMICONDUCTOR PROCESSING CHAMBER, SEMICONDUCTOR PROCESSING EQUIPMENT AND VAPOR EPITAXY EQUIPMENT

TECHNICAL FIELD

The present invention relates to the technical field of semiconductors, in particular to a semiconductor processing chamber, semiconductor processing equipment and vapor epitaxy equipment.

BACKGROUND

At present, plasma etching, physical vapor deposition (PVD in short), chemical vapor deposition (CVD in short) and other processes are normally applied to semiconductor process parts or substrates for micromachining, such as manufacturing of flexible display screens, flat panel displays, light-emitting diodes, solar cells and the like. Micromachining manufacturing contains a variety of different processes and steps. Chemical vapor deposition is relatively widely used, which can deposit multiple kinds of materials, including a wide range of insulating materials, most metals, and metal alloys, generally in a high vacuum reaction chamber.

With a characteristic dimension of a semiconductor device increasingly reducing and a degree of device integration increasingly improving, there is a growing demand for uniformity of a thin film for chemical vapor deposition. Chemical vapor deposition devices have been upgraded many times and their performance has been greatly improved, but there are still many deficiencies in uniformity of thin film deposition, especially with an increasing dimension of a substrate, existing vapor deposition methods and equipment have been difficult to meet uniformity requirements of a thin film.

In a thin film deposition process, a variety of process conditions, such as a flow direction and distribution of reaction gas, a heating temperature field of a substrate, pressure distribution in a reaction chamber and the like, will affect deposition uniformity of a thin film on a substrate surface. If process environments of reaction areas in the reaction chamber are not completely consistent, thin films deposited on the substrate surface will have nonuniform thickness, nonuniform compositions, nonuniform physical properties and other undesirable phenomena, thereby reducing a yield of substrate production. Therefore, there is a need to improve an existing chemical vapor deposition device to improve deposition uniformity of a thin film on a substrate. In addition, for an epitaxy growth process of a silicon or silicon germanium material, as the epitaxy material is usually a bottom layer of a semiconductor device, a critical dimension (CD) is very small, usually only a few nanometers, and can not withstand high temperature for a long time, otherwise the semiconductor device will be damaged, so a substrate needs to be heated to a temperature, such as 600-700 degrees, sufficient for epitaxy growth of the silicon material in a very short time. Due to this harsh temperature rise requirement, the silicon epitaxy process usually uses a high-power heat lamp to heat a substrate located in a reaction chamber through a transparent reaction chamber made of quartz. As air pressure in the reaction chamber is much lower than atmospheric pressure outside the quartz reaction chamber, it is necessary to design a pressure-resisting structure on the chamber in order to maintain a structure of the reaction chamber from being deformed or broken due to a huge pressure difference inside and outside the chamber. For example, multiple stiffeners are arranged around the reaction chamber of which upper and lower quartz chamber walls are in shapes of flat plates, or the upper and lower quartz chamber walls are designed to be in shapes of domes to resist the atmospheric pressure. These quartz outer walls usually have a wall thickness of 6-8 mm to resist the atmospheric pressure while allowing as much radiation energy as possible to permeate into the reaction chamber. These two structures are designed in opposite directions and technical effects of the two can not coexist, and the two structures have respective advantages and disadvantages in terms of influence on substrate processing. The flat-plate chamber can ensure stable distribution of a gas flow when flowing through the whole chamber, but a large number of stiffeners (more than 10) above may block radiation light for heating, resulting in nonuniform temperature distribution. For the dome reaction chamber, temperature distribution is more uniform, but the gas flow will produce a lot of chaotic turbulence when flowing into the dome reaction area, resulting in difficult control of gas flow distribution.

SUMMARY

In order to solve the above technical problems, the present invention aims to provide a semiconductor processing chamber configured to process a substrate, which can not only have good radiation transmittance and uniform temperature distribution, but further realize uniform and smooth gas flow distribution.

The present invention provides a semiconductor processing chamber, including:

a hollow chamber frame, provided with a gas inlet and a gas outlet and configured to introduce process gas, an opening being arranged on one side of the chamber frame;

an upper cover capable of permeating heat radiation, the upper cover being in matched connection with the opening and arranged on the chamber frame, the upper cover and the chamber frame enclosing a processing space, and the processing space being configured to accommodate the substrate and process the substrate;

a pressure-bearing shell, arranged above the upper cover and enclosing a confined space with the upper cover and at least part of the chamber frame; and a pressure-regulating device, configured to regulate pressure of the confined space.

Optionally, the pressure-bearing shell is hermetically connected to an outer sidewall of the chamber frame by a fastener.

Optionally, the chamber frame includes an upper frame and a lower frame, and the opening is arranged in the upper frame.

Optionally, the upper cover includes a window located in a central portion of the upper cover and an outer edge surrounding the window.

Optionally, the processing chamber further includes an assembly ring made of metal, the upper cover is hermetically mounted on the assembly ring, and the assembly ring is mounted on the opening.

Optionally, the window is made of transparent quartz and the outer edge is made of opaque or transparent quartz.

Optionally, the outer edge is hermetically fixed with an edge of the opening by a sealing ring.

Optionally, the pressure-regulating device includes a vacuum pump, and the pressure-bearing shell includes an extraction opening connected to the vacuum pump.

Optionally, the pressure-regulating device includes:

a monitoring module, configured to measure an air pressure value of the processing space and/or the confined space; and a control module, configured to preset a safety air pressure difference and regulate pressure of the processing space and the confined space according to the safety air pressure difference and based on the air pressure value.

Optionally, the pressure-bearing shell includes a heat exchange system.

Optionally, the heat exchange system includes a helium gas source introduced into the confined space.

Optionally, the chamber frame and/or the pressure-bearing shell are/is made of metal, and the upper cover is made of quartz.

Optionally, the pressure-regulating device is configured to regulate pressure of the confined space to be smaller than a standard atmospheric pressure in a process.

Optionally, the pressure-regulating device is configured to regulate pressure of the confined space to be smaller than 0.5 standard atmospheric pressure in a process.

Optionally, the processing chamber further includes a lower cover, the lower cover is arranged on the other side of the chamber frame oppositely to the upper cover, the processing space is enclosed by the upper cover, the lower cover and the chamber frame, the pressure-regulating device regulates pressure in the confined space in a process, such that air pressure borne by an outer surface of the upper cover is greater than or equal to that of the processing space and is smaller than that borne by an outer surface of the lower cover.

Optionally, the processing chamber further includes a lower cover, the lower cover is arranged on the other side of the chamber frame oppositely to the upper cover, the processing space is enclosed by the upper cover, the lower cover and the chamber frame, the confined space is communicated with the atmospheric environment by the pressure-regulating device, and a lower surface of the lower cover is in the atmospheric environment.

Optionally, the window has a shape of an upwardly curved dome or a flat plate or a downwardly curved depression.

Optionally, an annular stiffener is arranged on an upper surface of the window, the annular stiffener divides the window into a center area located in the annular stiffener and an edge area located between the outer edge and the annular stiffener, the annular stiffener is further provided with a plurality of air channels, and the air channels are configured to communicate a space between the center area and the edge area.

Furthermore, the present invention further discloses a semiconductor processing chamber, configured to process a substrate, including:

a chamber with a confined processing space, the chamber inducing an upper cover capable of permeating heat radiation, and the processing space being configured to accommodate the substrate and process the substrate;

a pressure-bearing shell, connected with a partial area of the chamber to form a confined space, at least a partial area of the upper cover being in the confined space; and a pressure-regulating device, configured to regulate pressure of the confined space.

Optionally, the chamber further includes a lower cover arranged oppositely to the upper cover, the confined space is communicated with the atmospheric environment by the pressure-regulating device, and at least a partial area of the lower cover is in the atmospheric environment.

Optionally, the upper cover is arranged integrally with the chamber or directly or indirectly arranged in an opening arranged in the chamber.

Optionally, the pressure-regulating device is configured to regulate pressure in the confined space to be greater than or equal to that in the processing space in a process.

Optionally, the pressure-regulating device is configured to regulate pressure in the confined space to be smaller than 1 standard atmospheric pressure in a process.

Optionally, the pressure-bearing shell is connected to an edge of the upper cover.

Optionally, at least a partial area of the chamber is located outside the confined space.

Optionally, the pressure-bearing shell is made of metal, and the upper cover is made of quartz.

Furthermore, the present invention provides semiconductor processing equipment, configured to process a substrate, including:

the semiconductor processing chamber as in any above;

a base located in the processing space and configured to bear the substrate; and a heating lamp group located in the confined space and configured to provide heat radiation for the substrate through the upper cover.

Optionally, the pressure-regulating device includes:

a monitoring module, configured to measure an air pressure value of the processing space and/or the confined space; and a control module, configured to preset an air pressure difference and regulate pressure of the processing space and the confined space according to the air pressure difference and based on the air pressure value.

Optionally, a substrate transferring opening is arranged in aside surface of the chamber frame.

Furthermore, the present invention provides vapor epitaxy equipment, including:

a hollow chamber frame, provided with a gas inlet and a gas outlet and configured to introduce process gas to form a silicon-containing epitaxy layer on a substrate, an opening being arranged on one side of the chamber frame;

an upper cover capable of permeating heat radiation, the upper cover being in matched connection with the opening and arranged on the chamber frame, the upper cover and the chamber frame enclosing a processing space, and the processing space being configured to accommodate the substrate and process the substrate;

a pressure-bearing shell, arranged above the upper cover and enclosing a confined space with the upper cover or enclosing a confined space with the upper cover and at least part of the chamber frame;

a pressure-regulating device, configured to regulate pressure of the confined space, the confined space being communicated with an atmospheric environment by the pressure-regulating device; and a heating lamp group located in the confined space, heat radiation emitted by the heating lamp group being capable of permeating the upper cover to heat the substrate.

Optionally, the pressure-regulating device is configured to regulate pressure in the confined space to be smaller than 1 standard atmospheric pressure in a process.

Optionally, the window has a shape of an upwardly curved dome or a flat plate or a downwardly curved depression.

Optionally, an annular stiffener is arranged on an upper surface of the window, the annular stiffener divides the window into a center area located in the annular stiffener and an edge area located between the outer edge and the annular stiffener, the annular stiffener is further provided with a plurality of air channels, and the air channels are configured to communicate a space between the center area and the edge area.

Optionally, the chamber further includes a lower cover arranged oppositely to the upper cover, the pressure-regulating device regulates pressure in the confined space in a process, such that air pressure borne by an outer surface of the upper cover is greater than or equal to that of the processing space and is smaller than that borne by an outer surface of the lower cover.

Optionally, the pressure-regulating device includes:

a monitoring module, configured to measure an air pressure value of the processing space and/or the confined space; and a control module, configured to preset an air pressure difference and regulate pressure of the processing space and the confined space according to the safety air pressure difference and based on the safety air pressure value.

The present invention has the advantages that: a semiconductor processing chamber is provided herein; by taking a chamber frame as a main structure of the processing chamber, an upper cover and a lower cover are arranged on opposite upper and lower sides of the chamber frame, such that the chamber frame, the upper cover and the lower cover can enclose a processing space; the chamber frame is provided with a gas inlet and a gas outlet and is connected with the processing space for introducing process gas; in the processing space, heat radiation, especially infrared radiation, can permeate the upper cover to process a substrate placed therein; a pressure-bearing shell is hermetically connected to the chamber frame, the pressure-bearing shell, the upper cover and at least part of the chamber frame enclose a confined space, and air pressure in the close space can be independently controlled by another pressure-regulating device, such that in the process, an air pressure difference borne by inner and outer surfaces of the upper cover is reduced compared with a situation when air pressure in the confined space is atmospheric pressure, the upper cover can be thinned to improve transmittance of infrared radiation; and meanwhile, the upper cover can be flattened to facilitate smooth gas flow, and a chemical deposition film formed on the surface of the substrate is more uniform. Particularly, in the process, the pressure-regulation device can be utilized to ensure that air pressure borne by the outer surface of the upper cover is greater than or equal to that of the processing space and is less than that borne by the outer surface of the lower cover, energy is saved to the maximum while the structure of the upper cover is preferred, and temperature of the upper cover is further accurately controlled. Moreover, the lower cover opposite to the upper cover can continuously maintain an original shape and strength, overall assembly of the chamber is more convenient and flexible, separate replacement of the upper cover which is easy to wear is simpler, cost is reduced compared with overall replacement of the processing chamber, various process conditions can be compatible, and equipment cost is greatly reduced.

BRIEF DESCRIPTION OF THE DRAWINGS

In order to more clearly illustrate the technical solutions in the embodiments of the present invention or in the prior art, the drawings to be used in description of the embodiments or the prior art will be briefly introduced below.

Obviously, the drawings in the following description are only some embodiments of the present invention, and those of ordinary skill in the art may obtain other drawings based on these drawings without creative work.

FIG. 1A is a structural schematic diagram of a section of FIG. 1B along a vertical direction, and FIG. 1C is an exploded view of FIG. 1B.

FIG. 2B is a schematic structural diagram of a section of FIG. 2A along line A-A;

FIG. 3B is a schematic structural diagram of a section of FIG. 3A along line B-B;

FIG. 4B is a schematic structural diagram of a section of FIG. 4A along line C-C;

FIG. 5B is a schematic structural diagram of a section of FIG. 5A along line D-D;

FIG. 6B is a schematic structural diagram of a section of FIG. 6A along line E-E, and FIG. 6C is a schematic structural diagram of a section of FIG. 6A along line F-F;

FIG. 7B is a schematic structural diagram of a section of FIG. 7A along line G-G;

FIG. 8B is a schematic structural diagram of a section of FIG. 8A along line H-H;

DETAILED DESCRIPTION

Figure 1A:
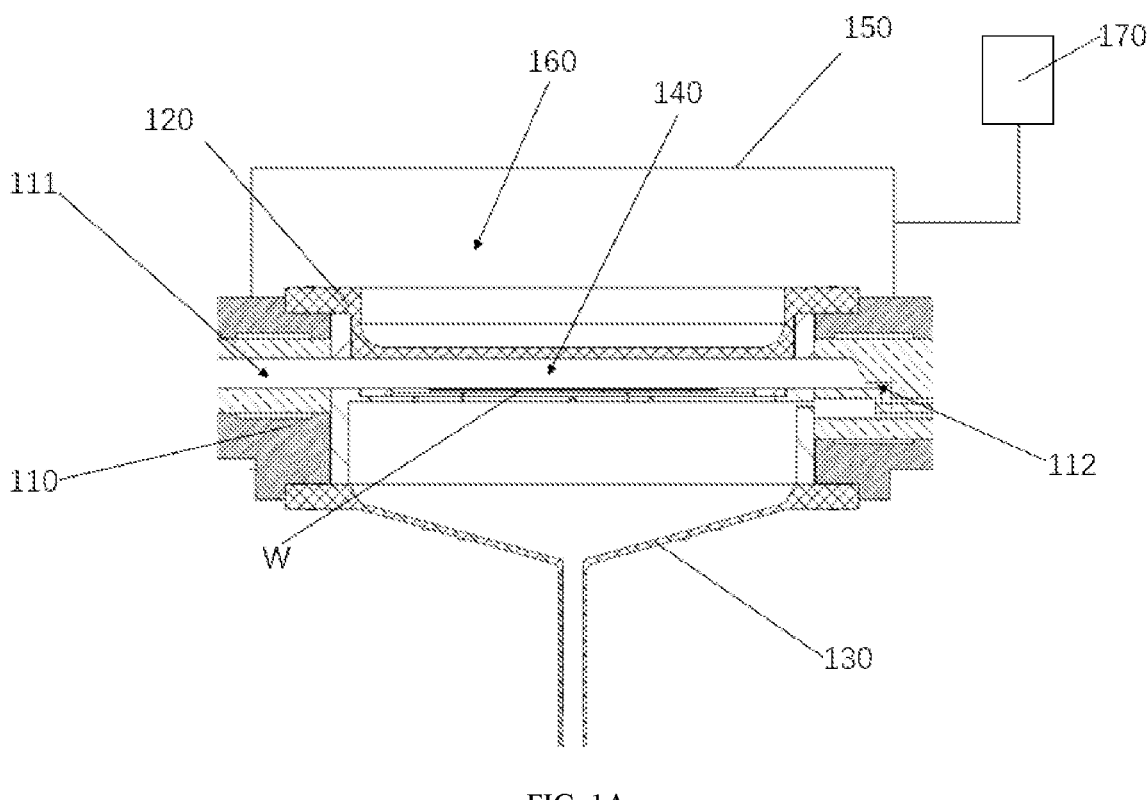
FIG. 1A, FIG. 1B and FIG. 1C are schematic structural diagrams of a semiconductor processing chamber of the present invention.

In order to make objectives, technical solutions and advantages of the embodiments of the present invention clearer, the technical solutions in the embodiments of the present invention will be clearly and completely described below in conjunction with the drawings of the embodiments of the present invention. Obviously, the described embodiments are part of, but not all of, the embodiments of the present invention. Based on the embodiments of the present invention, all other embodiments obtained by those of ordinary skill in the art without creative work are included in the protection scope of the present invention.

Based on the technical problem that the advantages of two technical solutions in the prior art are incompatible, the present invention provides an ingenious solution, which can overcome the deficiencies of the prior art, takes the advantages of the prior technical solution into consideration, has simple design, can ensure high infrared transmittance, can further realize uniform and smooth gas flow distribution, and simultaneously reduces use cost.

The present invention provides a semiconductor processing chamber, which can be applied to substrate processing in semiconductor equipment such as chemical vapor deposition equipment, atomic layer deposition equipment, plasma enhanced vapor deposition equipment, physical vapor deposition equipment and the like. Specifically, a substrate is placed in a processing space in a hollow chamber frame, an upper cover capable of permeating infrared radiation is assembled on the chamber frame and configured to heat the substrate, an infrared transmission area of the upper cover is at least partially covered by a pressure-bearing shell to form an airtight confined space, and meanwhile, a pressure-regulating device is utilized to regulate air pressure in the confined space, an air pressure difference borne by upper and lower surfaces of the upper cover can be regulated, thereby realizing structural design of the upper cover which is flatter, higher in infrared transmittance and sufficient in mechanical strength under a smaller air pressure difference to cope with continuously improved process requirements.

The present invention further provides an upper cover for the semiconductor processing chamber. The upper cover and the semiconductor processing chamber form a processing space, the upper cover and the pressure-bearing shell form a confined space, the upper cover is arranged between the processing space and the confined space to realize airtight isolation between the two. The upper cover has a lower surface facing the processing space and an upper surface facing the confined space. Specifically, the upper cover includes a window located in a central portion of the upper cover and an outer edge surrounding the window, the window can permeate heat radiation, the window includes a window center area located in the center and a window edge area surrounding the window center area, the window edge area is connected to the outer edge, a height difference between a lower surface of the window center area and that of the window edge area is smaller than or equal to 28 mm, and the upper cover can bear a pressure difference between the processing space and the confined space. The upper cover can not only ensure stable distribution of the gas flow in the overall chamber, but further bear the pressure difference between the upper and lower surfaces, and the infrared transmittance is relatively high.

Figure 1B:
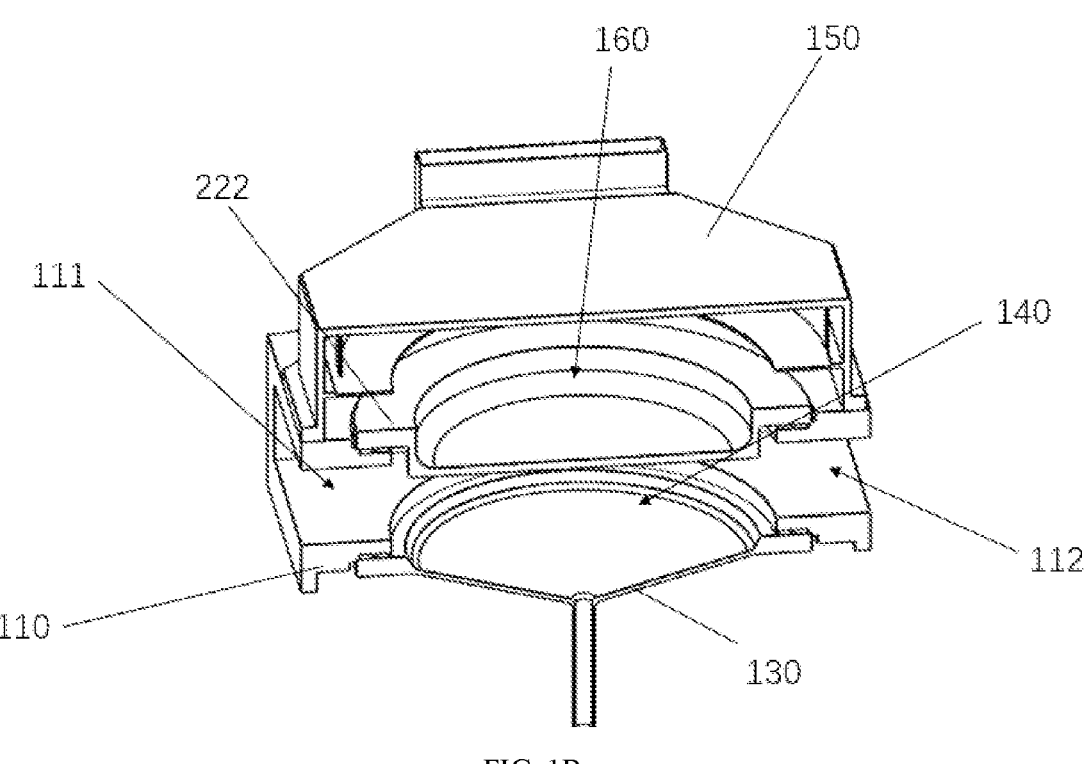
Figure 1C:
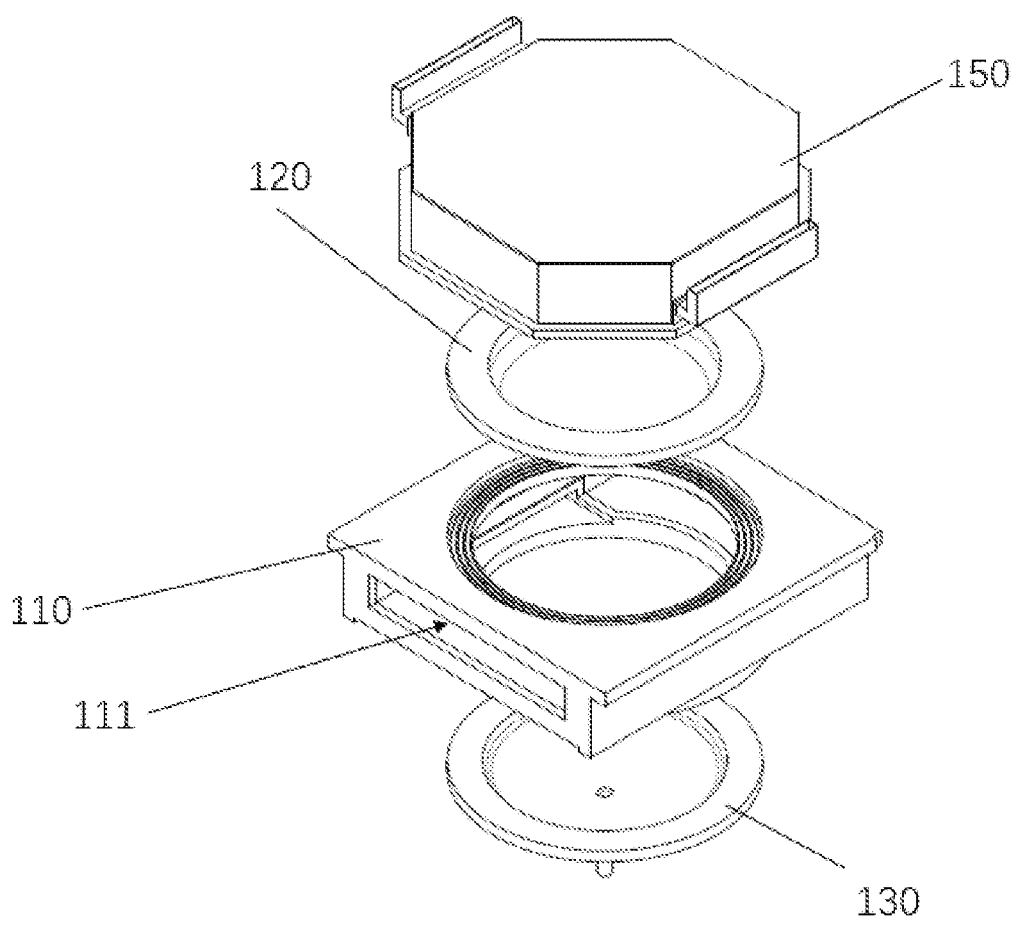

Various embodiments and variations are possible based on the above inventive concept, which will be described in detail below with reference to the drawings:

FIG. 1A, FIG. 1B and FIG. 1C are schematic structural diagrams of a semiconductor processing chamber of the present invention, FIG. 1A is a structural schematic diagram of a section of FIG. 1B along a vertical direction, and FIG. 1C is an exploded view of FIG. 1B.

FIGS. 1A-1C are schematic structural diagrams of a side surface of a semiconductor processing chamber of the present invention. The semiconductor processing chamber includes a chamber frame 110. In some embodiments, the chamber frame may be in a shape of a hollow pie, or a hollow cuboid, and the chamber frame may be integrally formed, or assembled by multiple parts. A gas inlet 111 and a gas outlet 112 are arranged on two opposite sides of the chamber frame, process gas is introduced into the gas inlet 111 by an external gas source, and an extraction pump can be connected to the gas outlet to pump out the process gas. In some embodiments, the gas inlet 111 and the gas outlet 112, as shown in FIG. 1A, are arranged on two opposite sides of the rectangular chamber frame 110, and may be arranged at other positions in other embodiments. The chamber frame 110 may be made of metal, thereby providing sufficient mechanical strength.

An upper cover 120 and a lower cover 130 are arranged on two opposite sides of the chamber frame 110. In the present embodiment, upper and lower surfaces of the rectangular chamber frame 110 are provided with openings corresponding to the upper cover 120 and the lower cover 130 in size, and the shapes and sizes of the openings can be regulated correspondingly according to the different shapes of the upper cover 120 and the lower cover 130. After the upper cover 120, the low cover 130 and the chamber frame 110 are assembled together, a processing space 140 can be enclosed at an inner side of the chamber frame 110, a to-be-processed substrate W can be placed in the processing space 140, the lower surface of the upper cover 120 is located in the processing space, the gas inlet 111 and the gas outlet 112 are communicated with the processing space 140 to enable the process gas to flow in the processing space 140, and the upper cover 120 can permeate infrared heat radiation. In some embodiments, the upper cover 120 is at least partially made of a transparent material, such as transparent quartz. In other embodiments, the lower cover 130 and the upper cover 120 are made of the same material. The device emitting heat radiation is arranged outside the upper cover, such that the heat radiation can irradiate the substrate W in the processing space 140 to perform a chemical vapor deposition process. In other embodiments, a device emitting heat radiation is also arranged outside the lower cover 130. In other embodiments, a heat radiation device outside the lower cover 130 may not be included, and only the infrared radiation permeated by the upper cover 120 is used for irradiating the substrate W to generate a deposition reaction.

In other embodiments, the chamber frame 110 and the upper cover 120 may also be of an integral structure, with higher infrared radiation transmittance at the upper cover 120 and higher mechanical strength and lower infrared transmittance at the chamber frame 110.

As shown in FIG. 1A, a pressure-bearing shell 150 is arranged outside the chamber frame 110. The pressure-bearing shell 150 may be made of metal and has a hollow structure with an opening. An edge of the opening of the pressure-bearing shell 150 is hermetically connected to the outside of the chamber frame 110 by a fastener, at least part of the upper surface of the chamber frame 110 is included in the hollow structure thereof, and the fastener may be a fastening bolt. In the present embodiment, the pressure-bearing shell 150 is hermetically connected to the upper surface of the chamber frame 110, and encloses a confined space 160 with the upper surface of the upper cover 120 and part of the upper surface of the chamber frame 110, wrapping of the upper surface of the upper cover 120 is realized by the smallest volume of the pressure-bearing shell, and the upper surface of the upper cover 120 is located in the confined space 160. In other embodiments, the pressure-bearing shell 150 may also be hermetically connected to a side wall or a bottom wall of the chamber frame 110.

Figure 1D:
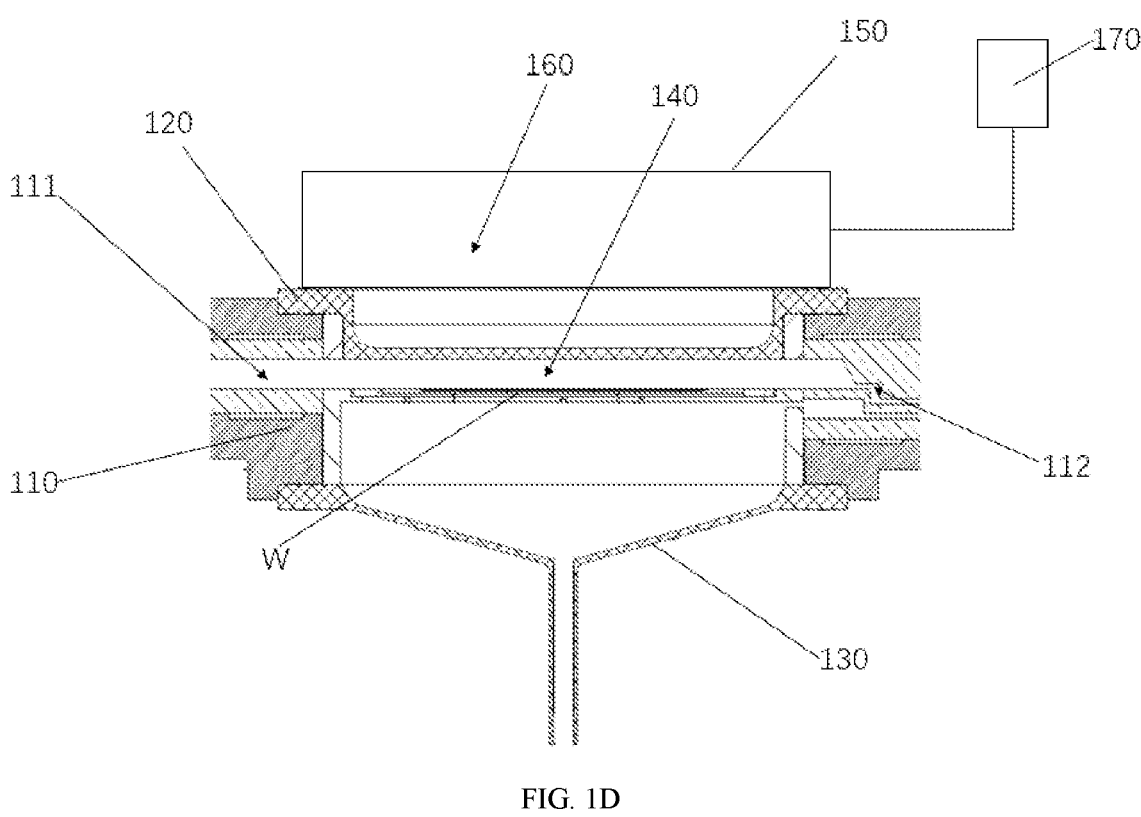
FIG. 1D is a schematic structural diagram of another semiconductor processing chamber of the present invention.

FIG. 1D is a schematic structural diagram of another semiconductor processing chamber of the present invention. Difference from the embodiment shown in FIG. 1A is that: the pressure-bearing shell 150 is connected to an edge of the upper cover 120, and a specific connection manner may be airtight connection by an assembly ring or a connection part and the like, and the confined space 160 is enclosed by the pressure-bearing shell 150 and part of the upper cover.

The pressure-bearing shell 150 is connected to the edge of the upper cover 120, which is suitable for a situation when a pressure difference between the confined space 160 formed by the pressure-bearing shell 150 and the upper cover 120 and external atmospheric environment is relatively small. In this way, pressure borne by the pressure-bearing shell 150 is relatively small, pressure of the pressure-bearing shell 150 on the edge of the upper cover 120 is relatively small, and the edge of the upper cover 120 is thus not easily crushed by the pressure-bearing shell 150. When the pressure difference between the confined space 160 and the external atmospheric environment is large, the pressure-bearing shell 150 cannot be directly located on the edge of the upper cover 120, and an adapter ring (not shown in the figure) is arranged between the pressure-bearing shell 150 and the edge of the upper cover 120. The adapter ring extends from the edge of the window 120 to the upper side of the chamber frame 110. The pressure is mainly borne by the chamber frame 110, and pressure borne by the edge of the window 120 is small, and the edge of the window 120 is thus not easily broken.

In the process, in order to perform a deposition reaction in the processing space 140, it is necessary to perform a pressure reduction operation on the processing space 140. At this time, there is a relatively large air pressure difference between the lower surface of the upper cover 120 in the processing space 140 and the upper surface of the upper cover 120 in the confined space 160. Generally, the environment of the lower surface of the upper cover 120 is close to a vacuum, and the air pressure of the upper surface of the upper cover 120 is close to atmospheric pressure, thereby requiring the upper cover to have sufficient mechanical strength to bear pressure. In the prior art, the mechanical strength may be improved by increasing thickness of the upper cover 120, but transmittance of infrared radiation may be reduced, resulting in a waste of power. Stiffeners may also be densely arranged outside the upper cover 120, but the infrared radiation is blocked, and a radiation difference is correspondingly generated on the substrate at a position with a stiffener and a position without a stiffener, resulting in nonuniform deposition. Or, the upper cover 120 may be made into an arch structure with a large arc, but distribution of the gas flow in the processing space 140 will be greatly changed accordingly, resulting in nonuniform gas flow and nonuniform deposition as well. Therefore, in the present invention, a pressure-regulating device 170 (please refer to FIG. 1A) is connected outside the pressure-bearing shell 150 for reducing the air pressure difference borne between the upper and lower surfaces of the upper cover 120 by regulating the air pressure in the confined space 160 in the process, such that the upper cover 120 can be made of quartz with a smaller thickness, and moreover, even if a side, facing the substrate W, of the upper cover 120 is made flat, the upper cover is not damaged by the inner and outer air pressure difference. In the present embodiment, the upper surface, corresponding to the substrate, of the upper cover 120 is surrounded by the confined space 160 enclosed by the pressure-bearing shell 150, and air pressure in the confined space 160 is reduced by the pressure-regulating device 170 in the process, an air pressure difference between the upper surface in the upper cover 120 and the confined space in a normal pressure state in the process is reduced, the shape and structure of the upper cover 120 are more flexible and can be regulated according to strict requirements of the process, thereby improving processing quality of the substrate W.

In some embodiments, the pressure-regulating device 170 may include a vacuum pump, a sealing tube is arranged on the pressure-bearing shell 150 to connect the confined space 160 to the vacuum pump, and air pressure in the confined space 160 is regulated according to feedback of a barometer.

In some embodiments, when performing the process, as a to-be-processed surface of the substrate W is mainly heated by infrared radiation permeated through the upper cover 120 and process gas flow mainly flows on the to-be-processed surface of the substrate W, the shape and thickness of the lower cover 130 are not highly required, that is, by thickening or forming a larger arch or utilizing stiffeners to improve the mechanical strength, the upper surface of the lower cover 130 may be made to be exposed to the atmospheric environment. By regulating the air pressure of the confined space 160, the air pressure borne by the upper surface of the upper cover 120 is made to be greater than or equal to that of the processing space 140 and less than that borne by the lower surface of the lower cover 130 in the process. For example, the air pressure in the confined space 160 is 0.5 atmospheric pressure, the air pressure in the processing space is close to vacuum, and the lower surface of the lower cover 130 bears 1 atmospheric pressure, By such design, in the process, when the processing space is pumped close to the vacuum, the upper cover with a thinner and flatter surface is utilized in the present invention, a bonding force of a molecular level of the material is enough to bear tension of the upper and lower surfaces due to different air pressures so as not to be broken in the working process, the thinner upper cover 120 has higher transmittance of infrared radiation, and under a condition that the substrate W obtains the same amount of radiation, a radiation source can consume less power. Meanwhile, the flatter surface allows the process gas in the processing space to circulate more smoothly and stably without locally generating eddy current and affecting the smoothness of a local gas reactant of the substrate W, thereby obtaining film forming uniformity at different positions of the substrate W. In addition, as the upper surface of the substrate W has higher requirements for heat radiation and gas flow uniformity, the lower surface mainly transfers heat by a base. As a support needs to be connected below the base for supporting the substrate, and a transmission mechanism which penetrates through the lower cover, a power mechanism which is located outside the processing chamber and the like are also arranged below, the lower cover is not as demanding as the upper cover in terms of thickness and shape. That is, the lower part of the processing chamber does not need to be modified in a large range, and the technical effect can be obtained only by combining the pressure-bearing shell 150 with the chamber frame. Preferably, the pressure-bearing shell 150 is combined with the upper surface of the chamber frame 110 to realize optimized design of the upper cover. In addition, certain air pressure is retained in the confined space 160, which can improve heat exchange efficiency of the gas flowing in the confined space 160. An air content is scarce in a vacuum environment, which is not conducive to heat transfer of the upper cover 120, and the temperature of the upper cover 120 can not be accurately controlled.

In other embodiments, the pressure-regulating device 170 includes monitoring modules, specifically, barometers located in the confined space 160 and the processing space 140 for feeding back air pressure signals of the environment in real time, and a control module for setting an initial safety pressure difference between the confined space 160 and the processing space 140, such as 0.5 standard atmospheric pressure or 0 standard atmospheric pressure. Under the safety pressure difference, the upper cover with a certain thickness adopted by the present invention can work safely, and when an air pressure signal fed back by the monitoring module has a difference with the initially-set safety pressure difference value by operation, the control module can also dynamically regulate to enable a pressure difference borne between the upper and lower surfaces of the upper cover 120 to be maintained at a preset value.

Figure 2A:
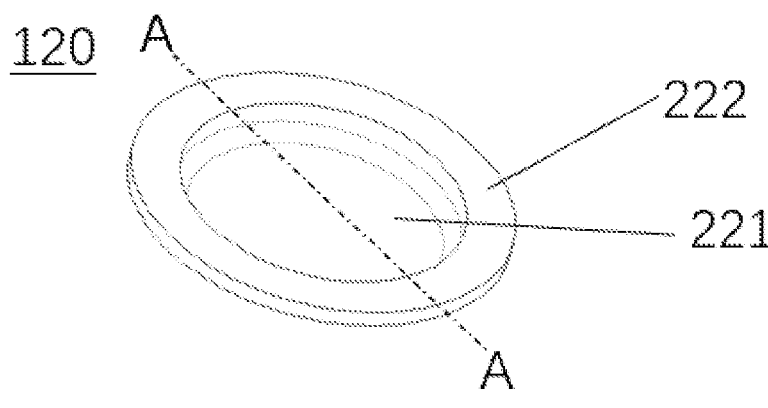
FIG. 2A and FIG. 2B are schematic structural diagrams of an upper cover of the present invention.
Figure 2B:
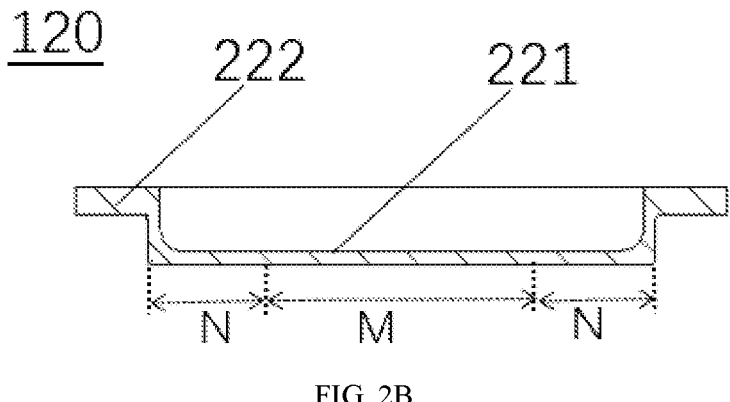

FIG. 2A and FIG. 2B are schematic structural diagrams of an upper cover of the present invention, and FIG. 2B is a schematic diagram of a section of FIG. 2A along line A-A.

Please referring to FIG. 2A and FIG. 2B, the upper cover 120 includes a window 221 area located in a central portion thereof and an outer edge 222 area surrounding the window 221. Upper surfaces of the window 221 and the outer edge 222 are not necessarily located on the same plane. For example, in the present embodiment, the window 221 is circular, the outer edge 222 is circular, the window 221 is lower than the outer edge 222 in FIG. 2B, and the window 221 and the outer edge 222 are connected by a vertical surface. Actually, a connecting portion between the window 221 and the outer edge 222 is not necessarily the vertical surface, for example, it may be an inclined surface, or even an arced surface, which is not limited herein.

A height difference between a lower surface of the window 221 and a lower surface of the outer edge 222 relies on the structure of the chamber frame 110. The outer edge 222 is carried on the chamber frame 110 (please refer to FIG. 1A, FIG. 1B and FIG. 1C), so as to realize sealing between the upper cover 120 and the chamber frame 110. A surface, facing the processing space 140, of the upper cover 120 is defined as a lower surface, and a surface, facing the confined space 160 of the upper cover 120 is defined as an upper surface. In the present embodiment, both the lower surface and the upper surface of the outer edge 222 are flat surfaces, which is conducive to pressed sealing between the lower surface of the outer edge 222 and the chamber frame 110 by a sealing strip, and to realization of sealing between the upper surface of the outer edge 222 and the pressure-bearing shell 150.

The window 221 is configured to permeate infrared radiation required by the substrate W. As the lower surface of the window 221 is approximately of the same height as a top of the gas inlet 111, in a process when the process gas flow enters the reaction chamber from the gas inlet and flows approximately horizontally through the lower surface of the window 221 until reaching the gas outlet, the process gas flow is approximately flat, which is conducive to uniformity of a film layer on a surface of the substrate W.

In addition, the thinner the window 221 is, the less amount of infrared radiation is lost through the window 221, and the lower surface of the window 221 is recessed in a direction away from the lower surface of the outer edge 222, that is, the closer a distance between the lower surface of the window 221 and the surface of the substrate W is, the less amount of infrared radiation is lost when the infrared radiation reaches the substrate through the window 221. Then, more infrared radiation reaches the surface of the substrate W, which is conducive to better heating of the surface of the substrate W.

In the present invention, by arranging the confined space 160 with independently regulatable pressure above the upper cover 120, and regulating the pressure in the confined space 160 to be smaller than the standard atmospheric pressure in the process, the air pressure difference between the upper surface and the lower surface of the upper cover 120 is reduced. Therefore, the window 221 of the upper cover 120 of the processing chamber has a smaller thickness and a higher flatness, so as to effectively improve the high transmittance of the window and the smoothness of the gas flow in the processing chamber, and prevent the window 221 from being damaged by the air pressure difference. In some embodiments, the window 221 is made of transparent quartz, and the outer edge 222 is made of opaque quartz, such that the outer edge 222 can protect the sealing strip from being directly irradiated by infrared radiation, thereby prolonging service life of the sealing strip. In other embodiments, the outer edge 222 may also be made of transparent quartz. In some other embodiments, the window 221 and the outer edge 222 may also have non-planar structures, which can be flexibly regulated according to actual process requirements.

In the present embodiment, the window 221 is circular, an area of the window 221 is greater than that of the substrate W, for example, a diameter of the substrate W is 300 mm, a diameter of the window 221 can be in a range of 400 mm to 470 mm, such that the substrate W and some parts at the edge of the substrate W are all heated, and a problem that heat of the surface of the substrate W is lost by the edge parts of the substrate W when only the substrate W is heated is avoided. However, a dimension of the window 221 in a horizontal direction is not too large, such that the window 221 can not only meet heating requirements, but also the volume of the reaction chamber can be prevented from being too large.

In the present embodiment, the window 221 includes a window center area M located in the center thereof and a window edge area N surrounding the window center area M, the edge area N is connected to the outer edge 222, and a height difference between the window center area M and the window edge area N is zero, such that the process gas flow is relatively smooth in a process of flowing from the window edge area N to the window center area M and then to the window edge area N, which is conductive to improving uniformity of a thin film formed on the surface of the substrate W.

In other embodiments, the height difference between the window center area M and the window edge area N is greater than 0 mm and smaller than or equal to 28 mm.

Figure 3A:
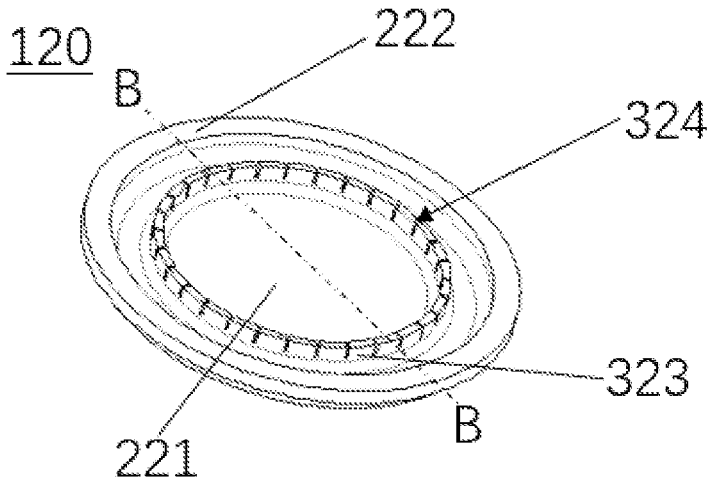
FIG. 3A and FIG. 3B are schematic structural diagrams of another upper cover of the present invention.
Figure 3B:
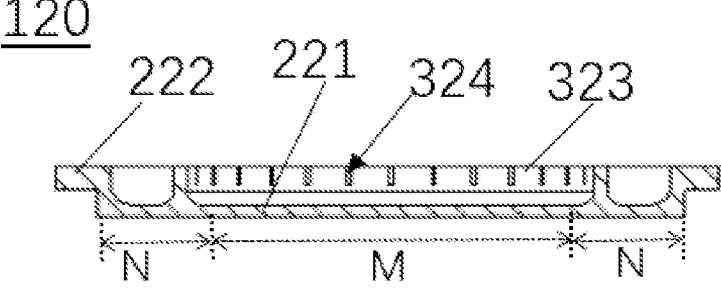

FIG. 3A and FIG. 3B are schematic structural diagrams of another upper cover of the present invention, and FIG. 3B is a schematic diagram of a section of FIG. 3A along line B-B.

Difference between the embodiment of the upper cover shown in FIG. 3A and FIG. 3B and that shown in FIG. 2A and FIG. 2B includes: a stiffener 323 is arranged on the upper surface of the window 221, in the present embodiment, the stiffener 323 has a complete annular structure, the complete annular stiffener 323 is a circle, actually, multiple circles of stiffeners 323 can be arranged, each circle of annular stiffener 323 may have a continuous annular structure, or each circle of annular stiffener 323 may be composed of a plurality of arc segments, and the plurality of arc segments constitute a circle of annular structure. In order to prevent blocking of the infrared radiation by the stiffener 323, no stiffener 323 may be arranged in an area, facing the window 221, of the substrate W.

In the present embodiment, a principle that the stiffener 323 can improve the mechanical strength of the upper cover 120 includes: from a microscopic point of view, the window 221 includes a plurality of interconnected window units, and when the stiffener 323 is added, the window unit is not only connected to other surrounding window units, but also connected to the stiffener 323, such that the window 221 has a greater bearing capacity for an upper and lower pressure difference compared with a situation when the window unit is merely connected to the surrounding window units. Therefore, after the stiffener 323 is arranged, the pressure-bearing capacity of the upper cover 120 is improved, and the window 221 can be further thinned out, which is capable of both preventing the upper cover from being broken, and also improving the capacity of the upper cover 120 to permeate heat radiation.

In the present embodiment, multiple air channels 324 are uniformly arranged in the stiffener 323, the stiffener 323 and the outer edge 222 form an edge area, an interior of the annular stiffener 323 forms a center area, the center area here is not the window center area M, the edge area here is not the window edge area N, the air channel 324 is configured to communicate the center area and the edge area, which is conductive to improving contact between a cooling gas flow and the window 221 and maintaining overall temperature control precision on the upper cover 120. The air channel 324 may be a through hole, an air groove, or an opening, and the number and positions of the air channels 324 are conductive to both a strength improvement effect of the stiffener 323 and a cooling gas circulation effect.

In the present embodiment, the window 221 includes a window center area M located in the center thereof and a window edge area N surrounding the window center area M, the edge area N is connected to the outer edge 222, and a height difference between the window center area M and the window edge area N is zero, such that the process gas flow is relatively smooth in a process of flowing from the window edge area N to the window center area M and then to the window edge area N, which is conductive to improving uniformity of a thin film formed on the surface of the substrate W.

In other embodiments, the height difference between the window center area M and the window edge area N is greater than 0 mm and smaller than or equal to 28 mm.

Figure 4A:
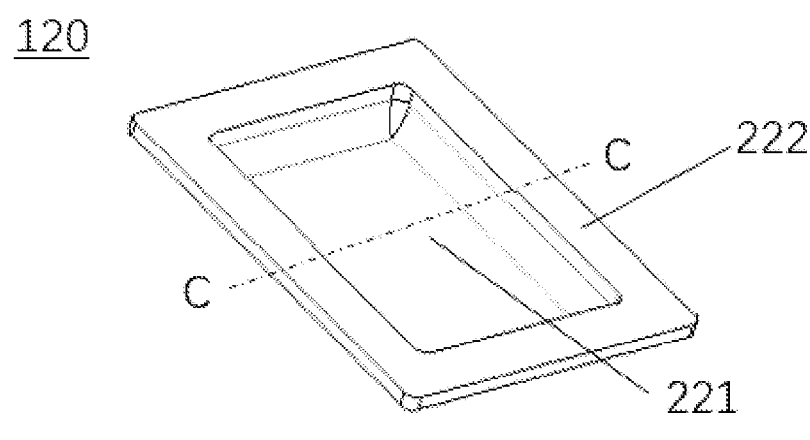
FIG. 4A and FIG. 4B are schematic structural diagrams of still another upper cover of the present invention.
Figure 4B:
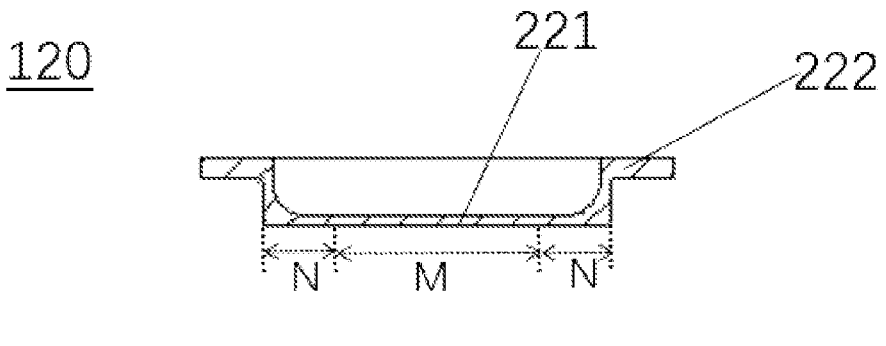

FIG. 4A and FIG. 4B are schematic structural diagrams of still another upper cover of the present invention, and FIG. 4B is a schematic diagram of a section of FIG. 4A along line C-C.

Please referring to FIG. 4A and FIG. 4B, difference from the embodiment shown in FIG. 2A and FIG. 2B includes: the window 221 is a rectangular plane, the outer edge 222 is a rectangular ring, in a gas flow direction from the gas inlet to the gas outlet, the upper cover 120 of the present embodiment has a longer window 221, which is conductive to a more sufficient time to form a laminar flow by the gas flow before reaching the substrate W.

In the present embodiment, the window 221 is rectangular, an area of an inscribed circle of the rectangle is required to be greater than that of the substrate W, the rectangular window includes long sides and short sides, the short side is 400-470 mm, the long side is 400-650 mm, such that the substrate W and parts at the edge of the substrate W are all heated, a problem that heat of the substrate W is lost by the parts at the edge of the substrate W when only the substrate W is heated is avoided, uniformity of temperature of the surface of the substrate W is better, which is conductive to formation of a thin film on the surface of the substrate W. In addition, as the long side and the short side are set to have such a ratio, smoothness improvement of the gas flow is facilitated, and easy temperature control on the substrate W is facilitated.

Figure 5A:
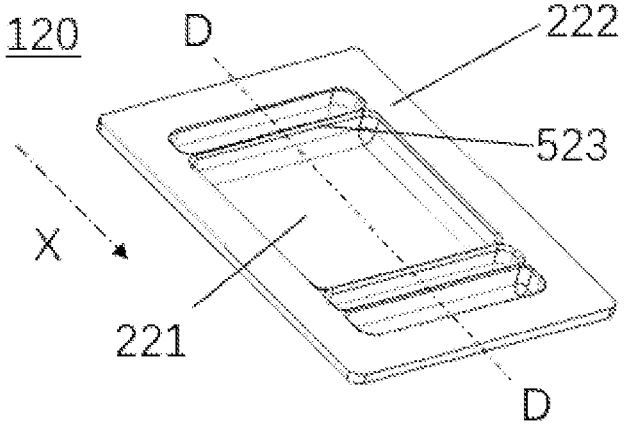
FIG. 5A and FIG. 5B are schematic structural diagrams of another upper cover of the present invention.
Figure 5B:
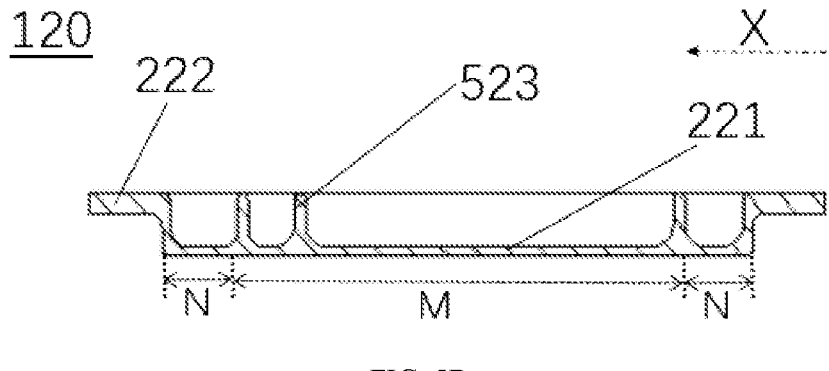

FIG. 5A and FIG. 5B are schematic structural diagrams of another upper cover of the present invention, and FIG. 5B is a schematic diagram of a section of FIG. 5A along line D-D.

Please referring to FIG. 5A and FIG. 5B, difference from the embodiment shown in FIG. 4A and FIG. 4B includes: strip-shaped stiffeners 523 perpendicular to the gas flow direction X are arranged at positions, close to the gas outlet and the gas inlet, of the window 221, so as to improve the mechanical strength of the window 221. The substrate W is placed below an area, closer to the gas inlet, of the center of the window 221. Correspondingly, the number of the stiffeners 523 arranged at the gas inlet is smaller than that of the stiffeners 523 arranged at the gas outlet, no stiffener 523 is arranged at a position, facing the window 221, of the substrate W, thereby avoiding blocking of the infrared radiation.

In the present embodiment, a principle that the stiffener 523 can improve the mechanical strength of the upper cover 120 includes: from a microscopic point of view, the window 221 includes a plurality of interconnected window units, and when the stiffener 523 is added, the window unit is not only connected to other surrounding window units, but also connected to the stiffener 523, such that the window 221 has a greater bearing capacity for an upper and lower pressure difference compared with a situation when the window unit is merely connected to the surrounding window units. Therefore, after the stiffener 523 is arranged, the pressure-bearing capacity of the upper cover 120 is improved, and the window 221 can be further thinned out, which is capable of both preventing the upper cover from being broken, and also improving the capacity of the upper cover 120 to permeate heat radiation.

In the present embodiment, the window 221 includes a window center area M located in the center thereof and a window edge area N surrounding the window center area M, the edge area N is connected to the outer edge 222, and a height difference between the window center area M and the window edge area N is zero, such that the process gas flow is relatively smooth in a process of flowing from the window edge area N to the window center area M and then to the window edge area N, which is conductive to improving uniformity of a thin film formed on the surface of the substrate W.

In other embodiments, the height difference between the window center area M and the window edge area N is greater than 0 mm and smaller than or equal to 28 mm.

Figure 6A:
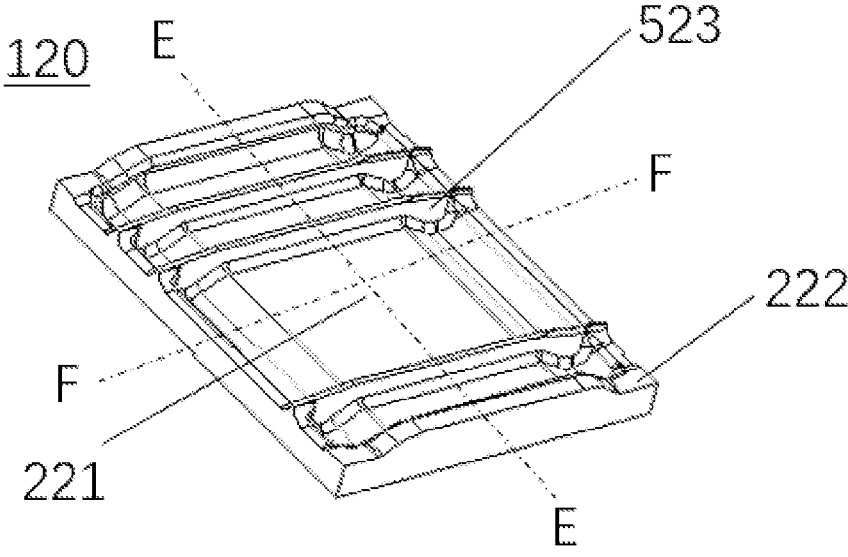
FIG. 6A, FIG. 6B and FIG. 6C are schematic structural diagrams of another upper cover of the present invention.
Figure 6B:
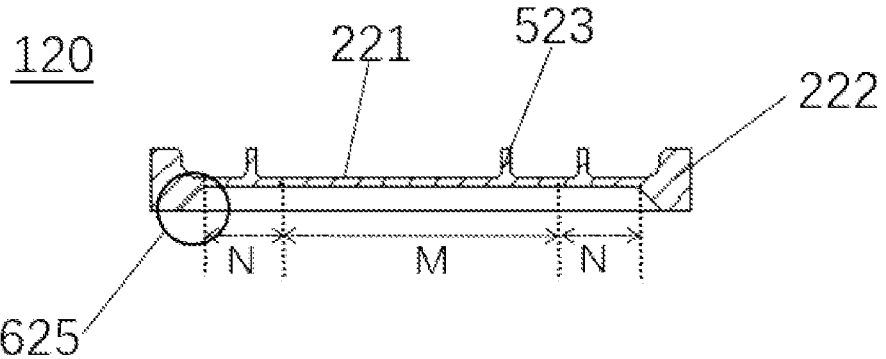
Figure 6C:
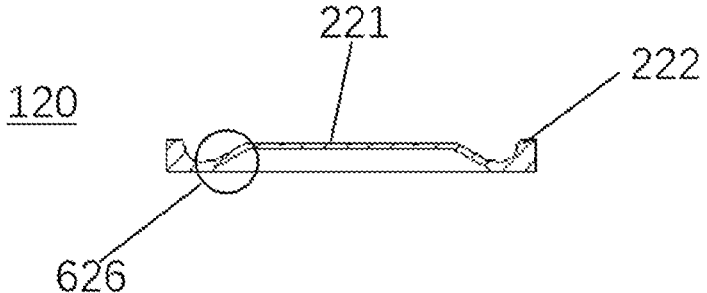

FIG. 6A, FIG. 6B and FIG. 6C are schematic structural diagrams of another upper cover of the present invention, FIG. 6B is a schematic structural diagram of a section along line E-E, and FIG. 6C is a schematic structural diagram of a section along line F-F.

Please referring to FIG. 6A, FIG. 6B and FIG. 6C, a plane of the lower surface of the window 221 is higher than that of the lower surface of the outer edge 222, such that the overall upper cover 120 is in an upwardly arched shape, and meanwhile, the window 221 is maintained in a planar structure. FIG. 6C is a section view of the upper cover 120 of the present embodiment along the line F-F perpendicular to the gas flow direction, the window 221 is connected to an inner side surface of the outer edge 222 by a second inclined surface 626 of a connecting part, such that a sudden upward rising degree can be reduced when the process gas enters the processing space from the gas inlet, and a turbulent flow can be prevented from being generated at the position. As shown in FIG. 6B, in the section view along the gas flow direction E-E, a first inclined surface 625 is arranged at a position, close to connection with the window, at the inner side of the outer edge, the first inclined surface 625 below the connection between the window 221 and the outer edge 222 can not only optimize regulation of the gas flow in the present embodiment, but also make the lower surface of the outer edge 222 on the same plane, which is more conductive to sealing of the upper cover 120 and the chamber frame 110, and the up-and-down plane will raise higher requirements for selection of the sealing strip, and the plane is easier to achieve uniform sealing strength. Meanwhile, in the present embodiment, a strip-shaped stiffener 323 connecting the window 221 and the outer edge 222 may also be arranged on the upper surface of the upper cover 120, thereby improving the mechanical strength thereof.

In the present embodiment, the window 221 includes a window center area M located in the center thereof and a window edge area N surrounding the window center area M, the edge area N is connected to the outer edge 222, and a height difference between the window center area M and the window edge area N is zero, such that the process gas flow is relatively smooth in a process of flowing from the window edge area N to the window center area M and then to the window edge area N, which is conductive to improving uniformity of a thin film formed on the surface of the substrate W.

In other embodiments, the height difference between the window center area M and the window edge area N is greater than 0 mm and smaller than or equal to 28 mm.

Figure 7A:
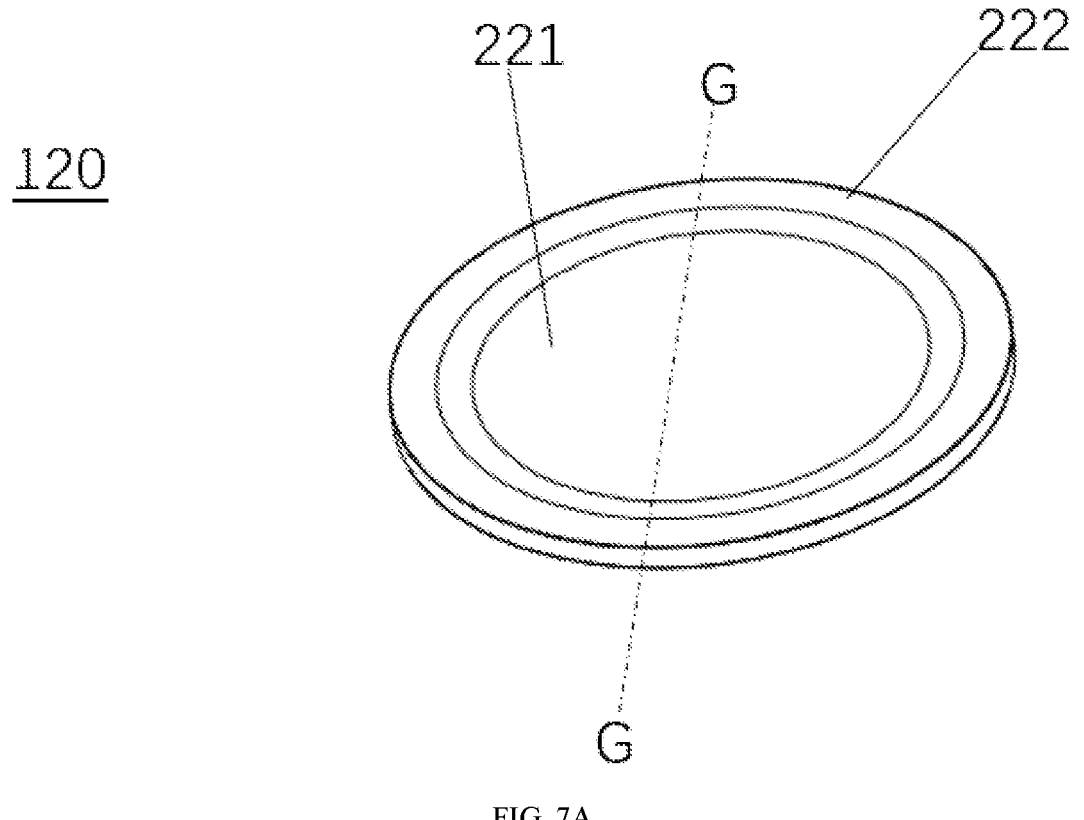
FIG. 7A and FIG. 7B are schematic structural diagrams of another upper cover of the present invention.
Figure 7B:
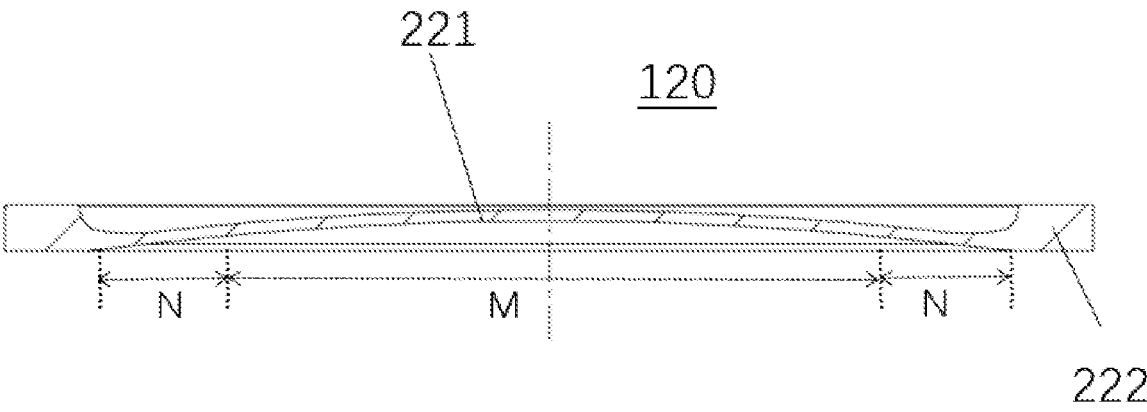

FIG. 7A and FIG. 7B are schematic structural diagrams of another upper cover of the present invention, and FIG. 7B is a schematic structural diagram of a section of FIG. 7A along line G-G.

In the present embodiment, the outer edge 222 is annular, and the lower surface of the window 221 protrudes toward the confined space relative to the lower surface of the outer edge 222, that is, the window 221 is arched. When the window 221 is arched, according to force analysis, one part of external air pressure borne by the chamber is resolved into a force along a tangent plane direction of the window 221, and the other part is resolved into a force perpendicular to the tangent plane direction of the window 221, and when the window 221 is a plane, the sum of the two forces needs to be borne, and after the window 221 is set to have an arched structure, the window only needs to bear the force perpendicular to the tangent plane of the window 221. Therefore, the arched window 221 can be made thinner compared with a flat-plate window to bear the pressure difference between the inside and outside of the window 221. Meanwhile, as the window 221 is relatively thin, the window 221 has high transmittance of infrared heat radiation, which is more conducive to temperature control on the substrate.

Specifically, the thickness of the window 221 ranges from 4 mm to 12 mm. Actually, the thickness of the window 221 is affected by the pressure difference between the inside and outside of the window 221 and an arch height of the arched structure of the window 221. The arch height refers to a height difference between lower surfaces of the window center area M and the window edge area N. When the arch height of the arched structure of the window 221 remains unchanged, the pressure difference between the inside and the outside of the window 221 is reduced, and the window 221 can be made thinner. Of course, the pressure difference between the inside and outside of the window 221 is remained unchanged, the arch height of the window 221 can be increased, and the window 221 can be made thinner. However, if the arch height is too high, it is not conducive to smoothness of the gas flow. The arch height of the window 221, the pressure difference between the inside and the outside of the window 221, and the thickness of the window 221 can be comprehensively regulated according to the process requirements, so as to meet the requirements of gas flow smoothness, pressure-bearing capacity, and heat permeability.

In the present embodiment, the thickness of the window 221 ranges from 4 mm to 12 mm; When the pressure difference between the inside and outside of the window 221 is from 0.2 standard atmospheric pressure to 0.8 standard atmospheric pressure, the height difference between the window center area M and the window edge area N is greater than 0 mm and smaller than or equal to 25 mm, that is, the height difference between the window center area M and the window edge area N is smaller. Therefore, in a process when the process gas flow enters a reaction chamber from the gas inlet, flows to the window center area M from the window edge area N and then to the window edge area N, the gas flow is relatively smooth and does not float upward too much, the overall process gas flow is smooth, which is conductive to uniformity of a thin film formed on the surface of the substrate W.

To sum up, the arched window 221 has a good pressure-bearing capacity, can be made thinner, and has a good permeation capacity of infrared heat radiation, and the arch height of the arched structure is not too large, which is conductive to ensuring the smoothness of the gas flow, so as to improve the uniformity of the thin film formed on the surface of the substrate.

Figure 8A:
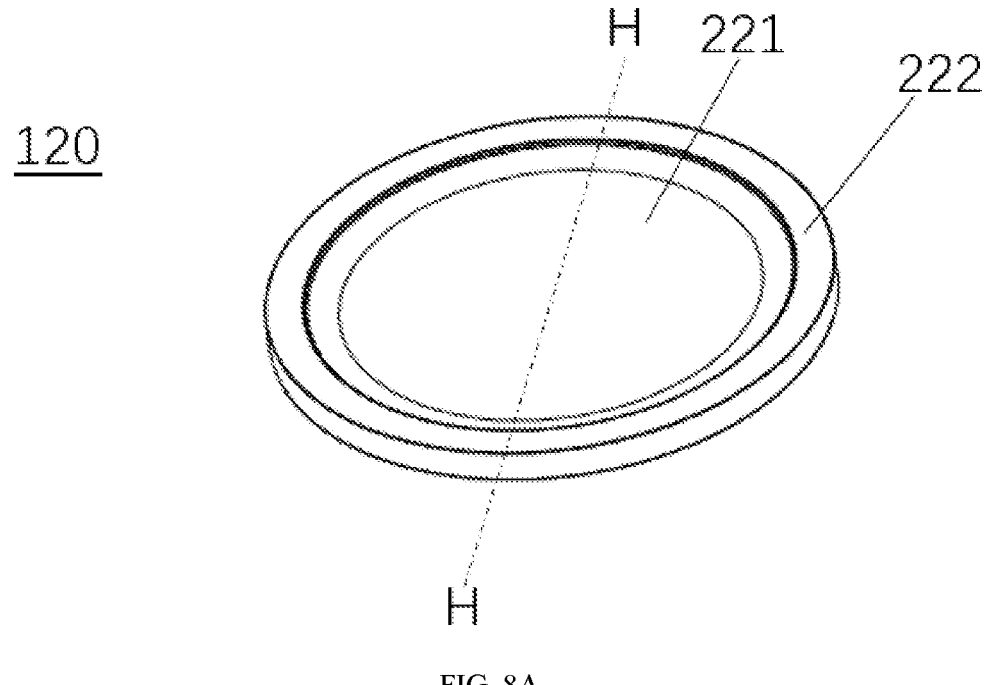
FIG. 8A and FIG. 8B are schematic structural diagrams of another upper cover of the present invention.
Figure 8B:
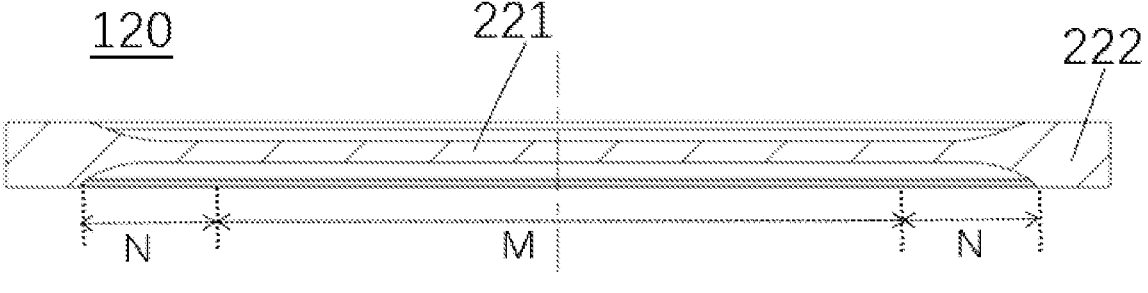

FIG. 8A and FIG. 8B are schematic structural diagrams of another upper cover of the present invention, and FIG. 8B is a schematic structural diagram of a section of FIG. 8A along line H-H.

Please referring to FIG. 8A and FIG. 8B, in the present embodiment, the outer edge 222 is annular, the window 221 includes a window center area M and a window edge area N, the window center area M has a flat-plate structure, and a center line of the window center area M is located between the lower surface and the upper surface of the outer edge 222. That is, the upper surface of the window center area M is lower than that of the outer edge 222, the lower surface of the window center area M is higher than that of the outer edge 222, the outer edge 222 and the window center area M are connected by the window edge area N with an arced surface, and the height difference between the edge area N and the center area M of the window 221 is smaller than or equal to 28 mm, such that the process gas flow is relatively smooth in a process of flowing from the window edge area N to the window center area M and then to the window edge area N, which is conductive to uniformity of a thin film formed on the surface of the substrate W.

The upper cover of the present invention is suitable for use in equipment that needs to bear environments in which the upper and lower surfaces of the upper cover are under different pressures, and the type of the equipment is not limited herein, and the following is a detailed description of the upper cover suitable for use in semiconductor processing equipment.

Figure 9:
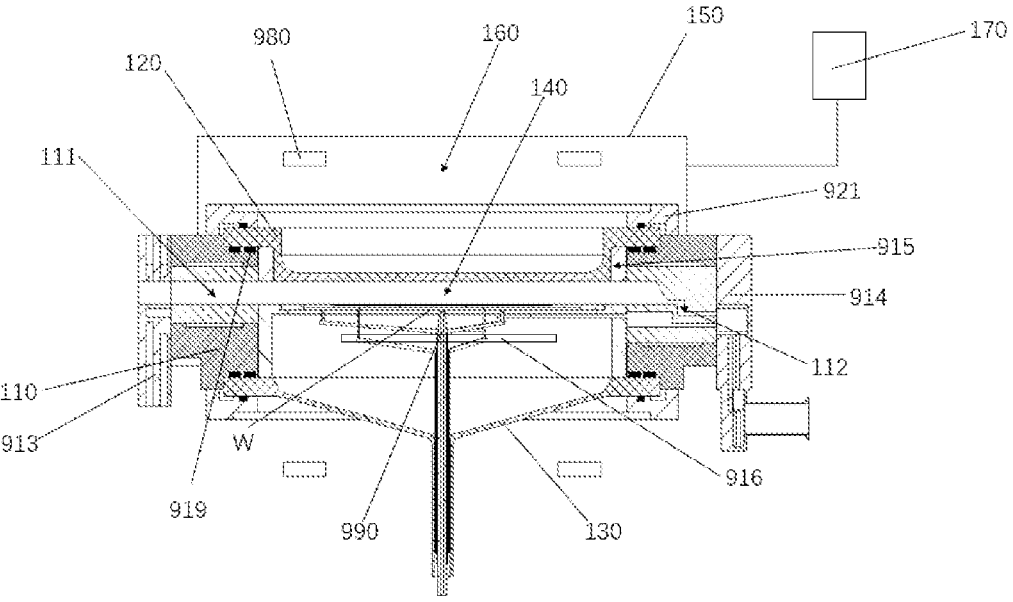
FIG. 9 is a schematic structural diagram of semiconductor processing equipment of the present invention.

FIG. 9 is a schematic structural diagram of semiconductor processing equipment of the present invention. The semiconductor processing equipment includes a chamber frame 110 made of metal and configured to provide a basis for assembly of other parts of the overall semiconductor equipment. A gas inlet 111 and a gas outlet 112 are arranged on opposite lateral sides of the chamber frame 110 for introducing process gas. An upper cover 120 and a lower cover 130 capable of permeating heat radiation are oppositely arranged on the upper and lower sides of the chamber frame 110, a corresponding opening 915 is arranged in the upper surface of the chamber frame 110, the upper cover 120 can be embedded in the opening 915 and is hermetically connected to the chamber frame 110 through a sealing strip 919, and the chamber frame 110, the upper cover 120, and the lower cover 130 enclose a processing space 140. The semiconductor processing equipment further includes a base 990 located in the processing space 140, with an upper surface bearing the substrate W and a lower surface supported by a support. A to-be-processed surface of the substrate W faces the upper cover 120, the support can drive the base 990 to rotate, a substrate transferring opening 916 is arranged at one side of the chamber frame 110 in a direction perpendicular to a gas inlet direction and lower than a plane of the gas inlet and the gas outlet, and the substrate transferring opening 916 may also be at another position. When the substrate W needs to be transferred before and after the process reaction, the support can drive the base to descend to the position of the substrate transferring opening 916 to facilitate transferring of the substrate W. The semiconductor processing equipment further includes a metal pressure-bearing shell 150, which is hermetically connected to the chamber frame 110 and forms a confined space 160 with the upper cover 120 and the chamber frame 110. A pressure-regulating device 170 is configured to reduce the air pressure difference between the upper surface of the upper cover 120 and the lower surface of the upper cover 120 compared with a situation when the air pressure in the confined space 160 is normal pressure by regulating the air pressure in the confined space 160 in the process, such that the shape and structure of the upper cover 120 are more conducive to transmission of infrared radiation and uniform circulation of the gas flow. In other embodiments, the semiconductor equipment further includes a heating lamp group 980, which is located in the confined space 160 and has a certain distance from the upper cover 120. The heating lamp group 980 emits infrared radiation to the outside to heat the substrate W through the upper cover 120, such that the substrate W is subjected to a chemical deposition reaction in a process gas environment. Meanwhile, a heating lamp may also be arranged outside the lower cover 130 to emit infrared radiation through the lower cover 130 to heat the based 990, thereby assisting a film forming reaction on the surface of the substrate W. In some other embodiments, the semiconductor equipment of the present invention further includes a gas inlet flange 913 and a gas outlet flange 914, both of which are internally provided with gas pipelines and can be connected to an external gas source to modulate the process gas, such that the deposition reaction in the processing space 140 is more uniform. In some embodiments, the upper cover 120 reinforces airtightness of the sealing strip 919 between the upper cover 120 and the chamber frame 110 by a press-on ring 921.

In the semiconductor processing equipment disclosed by the present invention, the upper cover 120 includes a transparent quartz window located in a central portion of the upper cover and an opaque quartz outer edge surrounding the window. The window can be circular or rectangular, and the outer edge is configured to be hermetically connected to the chamber frame by a sealing ring. The pressure-bearing shell 150 is further internally provided with a heat exchange system including a gas flow regulating system. The gas flow regulating system is configured to control temperature of the upper cover 120, and may include a helium gas source for filling into the confined space 160 for air circulation when the confined space 160 is in a low pressure state, so as to promote heat exchange between the upper cover and the pressure-bearing shell and realize the temperature control on the upper cover. The helium gas source can realize great heat exchange efficiency under low air pressure. Preferably, the pressure-regulating device 170 enables the air pressure borne by the upper surface of the upper cover 120 to be greater than or equal to that borne by the processing space 140 and smaller than that borne by the lower surface of the lower cover 130 in the process.

Figure 10:
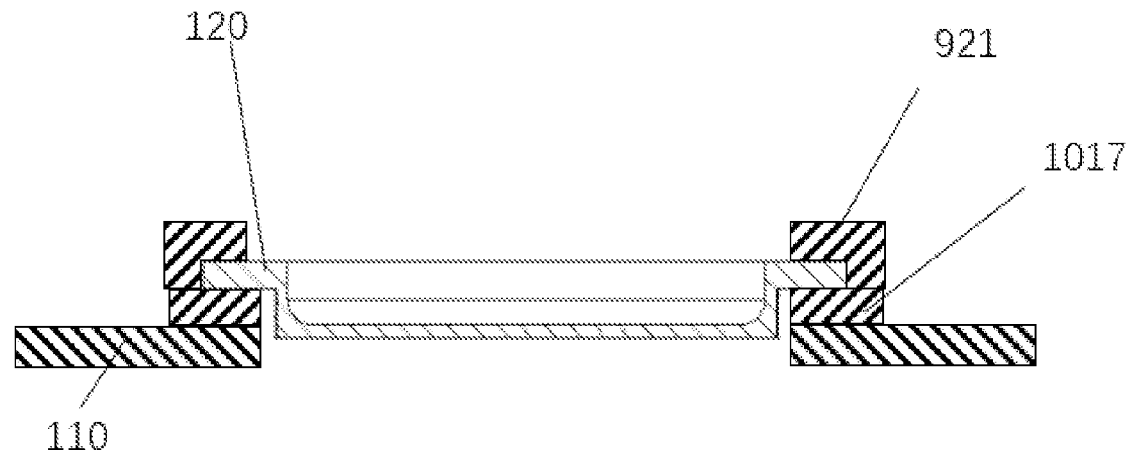
FIG. 10 is a schematic diagram of connection between an upper cover and a chamber frame in another embodiment of the present invention.

As shown in FIG. 10, in some embodiments, after the assembly ring 1017 and the press-on ring 921 are assembled on the upper cover 120, the upper cover 120 and the assembly ring 1017 are together mounted on the chamber frame 110. When the processing chamber needs to be maintained after multiple processes, the upper cover 120 and the assembly ring 1017 can be integrally disassembled and mounted. Frequent disassembly and assembly of the two parts will cause mounting errors at a contact place of the two, thus affecting a sealing effect. In addition, when the two parts are made of different materials, in superposition of effects of different heat expansion coefficients in the process, the mounting errors will be aggravated. In the present embodiment, the assembly ring 1017 after each time of disassembly and assembly and the chamber frame are made of the same material, compatibility in case of heat expansion is better, and good sealing performance in the long process can be maintained.

A type of the semiconductor processing equipment of the present invention is not limited, for example, the semiconductor processing equipment may be chemical vapor deposition equipment, and the chemical vapor deposition equipment is further divided into multiple types, which are not limited here. Epitaxy equipment in the chemical vapor deposition equipment is taken as an example for detailed description as follows.

Figure 11:
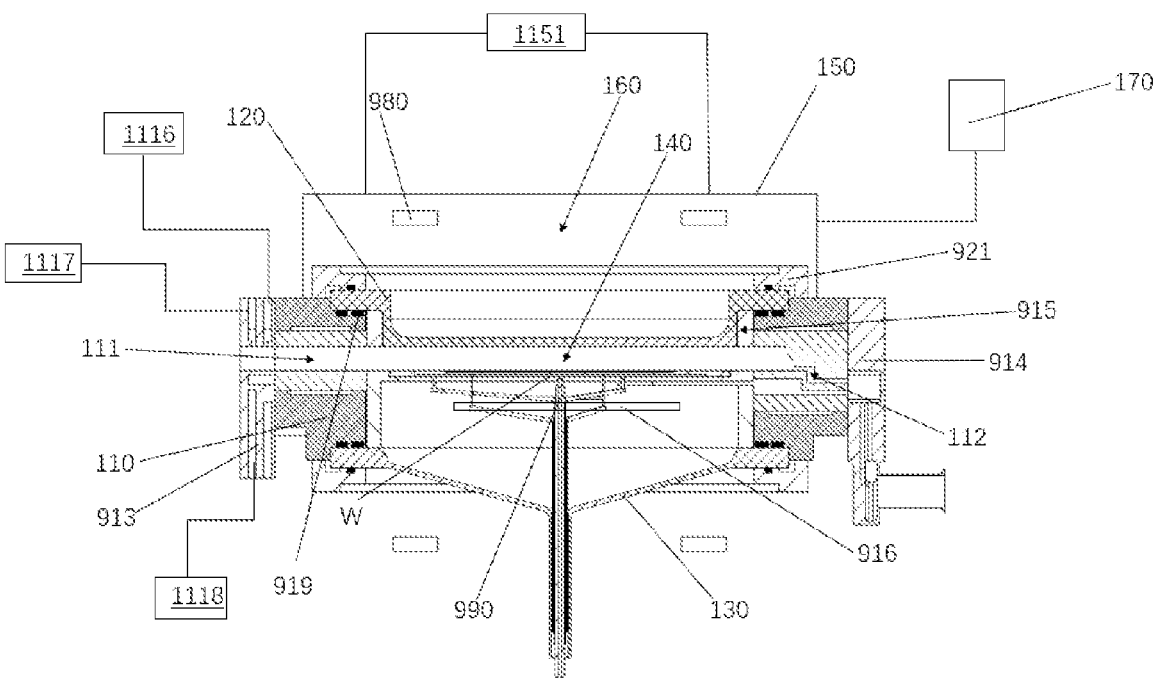
FIG. 11 is a schematic structural diagram of epitaxy equipment of the present invention.

FIG. 11 is a schematic structural diagram of vapor epitaxy equipment of the present invention. The vapor epitaxy equipment includes a chamber frame 110, an upper cover 120, a lower cover 130, a base 990, a pressure-bearing shell 150, a pressure-regulating device 170 and a heating lamp group 980. The chamber frame is provided with a gas inlet 111 and a gas outlet 112 and is configured to introduce process gas to form a silicon-containing epitaxy layer on a substrate W, the gas inlet 111 and the gas outlet 112 are assembled, in a matched manner, with a gas inlet flange 913 and a gas outlet flange 914, and the gas inlet flange 913 may be provided with multiple gas flow passages respectively connected to a first process gas 1116, a second process gas 1117, and a purge gas 1118. The upper cover 120 and the lower cover 130 are oppositely arranged on two sides of the chamber frame 110, the upper cover 120 is embedded in the opening 915 arranged in the chamber frame 110, airtight connection between the upper cover 120 and the chamber frame 110 is strengthened by the press-on ring 921 and the sealing strip 919, and the chamber frame 110, the upper cover 120, and the lower cover 130 enclose a processing space 140. The base 990 is located in the processing space 140 and configured to bear the substrate W. The pressure-bearing shell 150 is hermetically connected to the chamber frame 110, and encloses a confined space 160 with the upper cover 120 and the chamber frame 110. The pressure-regulating device 170 is configured to regulate air pressure of the confined space 160 in the process, such that the air pressure borne by the upper surface of the upper cover 120 is greater than that in the processing space 140 and smaller than that borne by the lower surface of the lower cover 130, thereby reducing the air pressure difference between the upper surface of the upper cover 120 and the lower surface of the upper cover 120. The heating lamp group 980 is located in the confined space 160, and heat radiation emitted by the heating lamp group is capable of permeating the upper cover 120 to heat the substrate W.

In other vapor epitaxy equipment disclosed in the present invention, there may be a heat exchange system 1151, which may be a gas flow regulating system externally connected to the pressure-bearing shell 150, so as to, after the pressure-regulating device 170 stabilizes the air pressure in the confined space 160, promote circulation of air in the confined space 160, control the temperature of the upper cover 120, and prevent deposition of the process gas on the lower surface of the upper cover 120. The heat exchange system 1151 may also include a fan arranged inside the confined space 160 to enhance the air circulation therein. The heat exchange system 1151 may also include a cooling fluid circulation system in the pressure-bearing shell 150 to remove excess heat transferred to the pressure-bearing shell 150.

According to the semiconductor processing chamber, the semiconductor processing equipment and the vapor epitaxy equipment disclosed by the present invention, by arranging a pressure-bearing shell above an upper cover capable of permeating heat radiation, an upper surface of a window of the upper cover is located in a confined space; by arranging a pressure-regulating device to regulate air pressure in the confined space to be smaller than external atmospheric pressure, an air pressure difference borne by the upper cover in a process is reduced. Therefore, an upper cover window may be designed to have a smaller thickness to improve heat radiation transmittance and transmission uniformity of the window, or may be designed to have a smaller arch height to improve smoothness of the process gas flow in the processing space. Smooth flow of the process gas in the processing space and uniform and efficient heating of the substrate by heat are the most important factors for uniform and rapid thin film growth of the substrate. In the present invention, the upper surface of the upper cover is arranged in the confined space formed by the pressure-bearing shell, and the air pressure of the confined space is regulated to be used as transition between the external atmospheric pressure and the air pressure of the internal processing space, the pressure difference borne by the upper and lower surfaces of the upper cover is reduced, the performances of the upper cover in aspects of heat radiation transmittance and gas flow regulation are improved, and uniformity and smoothness of substrate processing are further improved.

While the present invention has been described in detail with reference to the preferred embodiments, it should be understood that the above description should not be taken as limiting the invention. Various modifications and alternatives to the present invention will become apparent to those skilled in the art upon reading the foregoing disclosure. Accordingly, the protection scope of the present invention shall be limited by the appended claims.

What is claimed is:

1. A semiconductor processing chamber, configured to process a substrate, comprising:
   a chamber frame being hollow, provided with a gas inlet and a gas outlet, the gas inlet being configured to introduce process gas, and an opening being arranged at a first side of the chamber frame;
   an upper cover capable of permeating heat radiation, the upper cover being in matched connection with the opening and arranged on the chamber frame, the upper cover and the chamber frame enclosing a processing space, and the processing space being configured to accommodate the substrate and process the substrate;
   a pressure-bearing shell, arranged above the upper cover and enclosing a confined space with the upper cover and at least part of the chamber frame;
   a pressure-regulating device, configured to regulate pressure in the confined space; and further,
   a lower cover, arranged on a second side of the chamber frame oppositely to the upper cover, the processing space being enclosed by the upper cover, the lower cover and the chamber frame, and a lower surface of the lower cover being at least partially in an atmospheric environment.

2. The semiconductor processing chamber of claim 1, wherein the pressure-bearing shell is hermetically connected to an outer sidewall of the chamber frame by a fastener.

3. The semiconductor processing chamber of claim 1, wherein the chamber frame comprises an upper frame and a lower frame, and the opening is arranged in the upper frame.

4. The semiconductor processing chamber of claim 1, wherein the upper cover comprises a window located in a central portion of the upper cover and an outer edge surrounding the window.

5. The semiconductor processing chamber of claim 1, further comprising an assembly ring made of metal, wherein the upper cover is hermetically mounted on the assembly ring, and the assembly ring is mounted on the opening.

6. The semiconductor processing chamber of claim 4, wherein the window is made of transparent quartz and the outer edge is made of opaque or transparent quartz.

7. The semiconductor processing chamber of claim 4, wherein the outer edge is hermetically fixed with an edge of the opening by a sealing ring.

8. The semiconductor processing chamber of claim 1, wherein the pressure-regulating device comprises a vacuum pump, and the pressure-bearing shell comprises an extraction opening connected to the vacuum pump.

9. The semiconductor processing chamber of claim 1, wherein the pressure-regulating device comprises:
   a monitoring module, configured to measure an air pressure value of the processing space and/or the confined space; and
   a control module, configured to preset a safety air pressure difference and regulate the pressure of the processing space and the pressure of the confined space according to the safety air pressure difference and based on the air pressure value.

10. The semiconductor processing chamber of claim 1, wherein the pressure-bearing shell comprises a heat exchange system.

11. The semiconductor processing chamber of claim 10, wherein the heat exchange system comprises a helium gas source introduced into the confined space.

12. The semiconductor processing chamber of claim 1, wherein the chamber frame and/or the pressure-bearing shell are/is made of metal, and the upper cover is made of quartz.

13. The semiconductor processing chamber of claim 1, wherein the pressure-regulating device is configured to regulate the pressure of the confined space to be smaller than 1 standard atmospheric pressure during processing.

14. The semiconductor processing chamber of claim 1, wherein the pressure-regulating device is configured to regulate the pressure of the confined space to be smaller than 0.5 standard atmospheric pressure during processing.

15. The semiconductor processing chamber of claim 1, further comprising the lower cover, wherein the lower cover is arranged on the second side of the chamber frame oppositely to the upper cover, the processing space is enclosed by the upper cover, the lower cover and the chamber frame, the pressure-regulating device regulates the pressure in the confined space in a process, such that air pressure borne by an outer surface of the upper cover is greater than or equal to that of the processing space and is smaller than that borne by an outer surface of the lower cover.

16. The semiconductor processing chamber of claim 1, wherein the confined space is communicated with the atmospheric environment by the pressure-regulating device.

17. The semiconductor processing chamber of claim 4, wherein the window has a shape of an upwardly curved dome or a flat plate or a downwardly curved depression.

18. The semiconductor processing chamber of claim 17, wherein an annular stiffener is arranged on an upper surface of the window, the annular stiffener divides the window into a center area located in the annular stiffener and an edge area located between the outer edge and the annular stiffener, the annular stiffener is further provided with a plurality of air channels, and the plurality of air channels are configured to communicate a space between the center area and the edge area.

19. A semiconductor processing chamber, configured to process a substrate, comprising:

a chamber with a confined processing space, the chamber comprising an upper cover capable of permeating heat radiation, and the confined processing space being configured to accommodate the substrate and process the substrate;

a pressure-bearing shell, connected with a partial area of the chamber to form a confined space, at least a partial area of the upper cover being in the confined space;

a pressure-regulating device, configured to regulate pressure of the confined space; and further, a lower cover arranged oppositely to the upper cover, at least a partial area of the lower cover being in an atmospheric environment.

20. The semiconductor processing chamber of claim 19, wherein the confined space is communicated with the atmospheric environment by the pressure-regulating device.

21. The semiconductor processing chamber of claim 19, wherein the upper cover is arranged integrally with the chamber or directly or indirectly arranged in an opening arranged in the chamber.

22. The semiconductor processing chamber of claim 19, wherein the pressure-regulating device is configured to regulate the pressure in the confined space to be greater than or equal to that in the confined processing space in a process.

23. The semiconductor processing chamber of claim 22, wherein the pressure-regulating device is configured to regulate the pressure in the confined space to be smaller than 1 standard atmospheric pressure in the process.

24. The semiconductor processing chamber of claim 19, wherein the pressure-bearing shell is connected to an edge of the upper cover.

25. The semiconductor processing chamber of claim 19, wherein at least a partial area of the chamber is located outside the confined space.

26. The semiconductor processing chamber of claim 19, wherein the pressure-bearing shell is made of metal, and the upper cover is made of quartz.

27. The semiconductor processing chamber of claim 1, further comprising:

a base located in the processing space and configured to bear the substrate; and a heating lamp group located in the confined space and configured to provide the heat radiation for the substrate through the upper cover.

28. The semiconductor processing chamber of claim 27, wherein the pressure-regulating device comprises:

a monitoring module, configured to measure an air pressure value of the processing space and/or the confined space; and a control module, configured to preset an air pressure difference and regulate the pressure of the processing space and the confined space according to the air pressure difference and based on the air pressure value.

29. The semiconductor processing chamber of claim 27, wherein a substrate transferring opening is arranged in a side surface of the chamber frame.

30. Vapor epitaxy equipment, comprising:

a chamber frame being hollow, provided with a gas inlet and a gas outlet and configured to introduce process gas to form a silicon-containing epitaxy layer on a substrate, an opening being arranged on one side of the chamber frame;

an upper cover capable of permeating heat radiation, the upper cover being in matched connection with the opening and arranged on the chamber frame, the upper cover and the chamber frame enclosing a processing space, and the processing space being configured to accommodate the substrate and process the substrate;

a pressure-bearing shell, arranged above the upper cover and enclosing a confined space with the upper cover or enclosing the confined space with the upper cover and at least part of the chamber frame;

a pressure-regulating device, configured to regulate pressure of the confined space, the confined space being communicated with an atmospheric environment by the pressure-regulating device; and a heating lamp group located in the confined space, the heat radiation emitted by the heating lamp group being capable of permeating the upper cover to heat the substrate.

31. The vapor epitaxy equipment of claim 30, wherein the pressure-regulating device is configured to regulate the pressure in the confined space to be smaller than 1 standard atmospheric pressure in a process.

32. The vapor epitaxy equipment of claim 30, wherein a window has a shape of an upwardly curved dome or a flat plate or a downwardly curved depression.

33. The vapor epitaxy equipment of claim 32, wherein an annular stiffener is arranged on an upper surface of the window, the annular stiffener divides the window into a center area located in the annular stiffener and an edge area located between an outer edge and the annular stiffener, the annular stiffener is further provided with a plurality of air channels, and the plurality of air channels are configured to communicate a space between the center area and the edge area.

34. The vapor epitaxy equipment of claim 30, wherein a chamber further comprises a lower cover arranged oppositely to the upper cover, the pressure-regulating device regulates the pressure in the confined space in a process, such that air pressure borne by an outer surface of the upper cover is greater than or equal to that of the processing space and is smaller than that borne by an outer surface of the lower cover.

35. The vapor epitaxy equipment of claim 30, wherein the pressure-regulating device comprises:

a monitoring module, configured to measure an air pressure value of the processing space and/or the confined space; and a control module, configured to preset an air pressure difference and regulate the pressure of the processing space and the pressure of the confined space according to a safety air pressure difference and based on a safety air pressure value.

* * * * *